United States Patent
Nordquist et al.

(10) Patent No.: US 9,590,284 B1
(45) Date of Patent: Mar. 7, 2017

(54) SELF-LIMITING FILTERS FOR BAND-SELECTIVE INTERFERER REJECTION OR COGNITIVE RECEIVER PROTECTION

(71) Applicant: Sandia Corporation, Albuquerque, NM (US)

(72) Inventors: Christopher Nordquist, Albuquerque, NM (US); Sean Michael Scott, West Lafayette, IN (US); Joyce Olsen Custer, Albuquerque, NM (US); Darin Leonhardt, Albuquerque, NM (US); Tyler Scott Jordan, Albuquerque, NM (US); Christopher T. Rodenbeck, Alexandria, VA (US); Paul G. Clem, Albuquerque, NM (US); Jeff Hunker, Albuquerque, NM (US); Steven L. Wolfley, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 30 days.

(21) Appl. No.: 14/721,890

(22) Filed: May 26, 2015

Related U.S. Application Data

(60) Provisional application No. 62/003,494, filed on May 27, 2014.

(51) Int. Cl.
*H01P 1/203* (2006.01)
*H03G 11/04* (2006.01)
*H01P 1/201* (2006.01)

(52) U.S. Cl.
CPC ............ *H01P 1/203* (2013.01); *H01P 1/2013* (2013.01); *H03G 11/04* (2013.01)

(58) Field of Classification Search
CPC . G01S 19/21; H01P 1/227; H01P 9/00; H03G 11/02; H03G 11/006; H03G 9/00; H03H 2/001; H03H 7/0107
USPC .................................................. 333/17.2, 204
See application file for complete search history.

(56) References Cited

U.S. PATENT DOCUMENTS

| | | | | |
|---|---|---|---|---|
| 5,187,459 A | * | 2/1993 | Russell | H01P 1/20381 333/204 |
| 5,280,256 A | * | 1/1994 | Tan | H01P 1/20336 333/167 |
| 5,949,311 A | * | 9/1999 | Weiss | H01P 1/215 333/202 |
| 6,828,884 B2 | * | 12/2004 | Wyeth | H01P 1/10 257/3 |
| 7,642,881 B1 | | 1/2010 | Robinson et al. | |

(Continued)

OTHER PUBLICATIONS

U.S. Appl. No. 13/932,859, filed Jul. 1, 2013, Olsson et al.
(Continued)

*Primary Examiner* — Dean Takaoka
*Assistant Examiner* — Alan Wong
(74) *Attorney, Agent, or Firm* — Martin I. Finston; Aman Talwar

(57) ABSTRACT

The present invention related to self-limiting filters, arrays of such filters, and methods thereof. In particular embodiments, the filters include a metal transition film (e.g., a $VO_2$ film) capable of undergoing a phase transition that modifies the film's resistivity. Arrays of such filters could allow for band-selective interferer rejection, while permitting transmission of non-interferer signals.

11 Claims, 4 Drawing Sheets

(56) References Cited

U.S. PATENT DOCUMENTS

| | | | |
|---|---|---|---|
| 8,067,996 B2 | 11/2011 | Hillman et al. | |
| 8,305,164 B1 * | 11/2012 | Jachowski | H01P 1/2039 333/110 |
| 8,994,471 B2 * | 3/2015 | Ryu | H01P 1/005 333/127 |
| 9,270,246 B1 * | 2/2016 | Bouchez | H03G 11/02 |

OTHER PUBLICATIONS

Aurelian C et al., "Chapter 3: Exploiting the semiconductor-metal phase transition of VO2 materials: a novel direction towards tuneable devices and systems for RF-microwave applications," in *Advanced Microwave and Millimeter Wave Technologies Semiconductor Devices Circuits and Systems*, Moumita Mukherjee (ed.), InTech, published online Mar. 1, 2010, available at http://www.intechopen.com/books/advanced-microwave-and-millimeter-wave-technologies-semiconductor-devices-circuits-and-systems/exploiting-the-semiconductor-metal-phase-transition-of-vo2-materials-a-novel-direction-towards-tunea (last accessed Nov. 25, 2013) (pp. 35-56).

Bossard JA et al., "Tunable frequency selective surfaces and negative-zero-positive index metamaterials based on liquid crystals," *IEEE Trans. Antennas Propagation* 2008;56(5):1308-20.

Cavalleri A et al., "Ultra-broadband femtosecond measurements of the photo-induced phase transition in $VO_2$: from the mid-IR to the hard X-rays," *J. Phys. Soc. Japan 2006*; 75(1):011004 (pp. 1-9).

Coutts GM et al., "A MEMS-tunable frequency-selective surface monolithically integrated on a flexible substrate," *IEEE/MTT-S International Microwave Symposium*, held in Honolulu, HI on Jun. 3-8, 2007 (pp. 497-500).

Futaki H et al., "Effects of various doping elements on the transition temperature of vanadium oxide semiconductors," *Japan. J. Appl. Phys.* 1969; 8(8):1008-13.

Givernaud J et al., "Microwave power limiting devices based on the semiconductor—metal transition in vanadium—dioxide thin films," *IEEE Trans. Microw. Theory Tech.* 2010;58(9):2352-61.

Jaimes-Vera A et al., "Review on microwave and millimeter filters using MEMS technology," *17th International Conference on Electronics, Communications and Computers*, held in Cholula, Puebla on Feb. 26-28, 2007 (6 pp.).

Jordan TS et al., "Model and characterization of $VO_2$ thin-film switching devices," *IEEE Trans. Electron Devices* 2014;61(3):813-9.

Katehi LPB et al., "Micromachined circuits for millimeter- and sub-millimeter-wave applications," *IEEE Antennas Propagation Mag.* 1993;35(5):9-17.

Liu Y et al., "Distributed MEMS transmission lines for tunable filter applications," *Int'l J. RF Microw. Computer-Aided Engineering* 2001;11(5):254-60.

Monni S et al., "Limiting frequency selective surfaces," *Proc. of the 39th European Microwave Conference*, held in Rome, Italy on Sep. 29-Oct. 1, 2009 (pp. 606-609).

Rauscher C, "A channelized-limiter approach to receiver front-end protection," *IEEE Trans. Microw. Theory Tech.* 1996;44(7):1125-9.

Ruzmetov D et al., "Correlation between metal-insulator transition characteristics and electronic structure changes in vanadium oxide thin films," *Phys. Rev. B* 2008;77:195442 (5 pp.).

Schoenlinner B et al., "Switchable low-loss RF MEMS *Ka*-band frequency-selective surface," *IEEE Trans. Microw. Theory Tech.* 2004;52(11):2474-81.

Scott S et al., "A frequency selective surface with integrated limiter for receiver protection," *IEEE Antennas and Propagation Society International Symposium (APSURSI)*, held in Chicago, IL on Jul. 8-14, 2012 (pp. 1-2).

Scott S et al., "Band-selective interferer rejection for cognitive receiver protection," *IEEE MTT-S International Microwave Symposium Digest (IMS)*, held in Seattle, WA on Jun. 2-7, 2013 (pp. 1-4).

Scott S et al., "Frequency-selective surfaces with integrated limiter for receiver protection," presented at the *IEEE Antennas and Propagation Society International Symposium (APSURSI)*, held in Chicago, IL on Jul. 12, 2012 (17 pp.).

Zylbersztejn A et al., "Metal-insulator transition in vanadium dioxide," *Phys. Rev. B* 1975;11(11):4383-95.

* cited by examiner

SELF-LIMITING FILTERS FOR BAND-SELECTIVE INTERFERER REJECTION OR COGNITIVE RECEIVER PROTECTION

CROSS-REFERENCE TO RELATED APPLICATION

This application claims the benefit of U.S. Provisional Application No. 62/003,494, filed May 27, 2014, which is incorporated herein by reference in its entirety.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to self-limiting filters, arrays of such filters, and methods thereof. In particular embodiments, the filters include a metal transition film (e.g., a $VO_2$ film) capable of undergoing a phase transition that modifies the film's resistivity.

BACKGROUND OF THE INVENTION

Radio frequency electronics employ various transmitter and receiver components for advanced telecommunication and tracking systems. Such components include amplifiers and filters that can be sensitive to damage arising from high-powered interferers. Current technologies to protect sensitive receivers include frequency-selective surfaces, antennas, diodes, or ferrite-based limiters, which can introduce unwanted harmonics. Further, many available technologies are incompatible with traditional fabrication processes. In addition, some of the available limiters are not frequency selective, meaning that all input signals are reflected if an interferer is present. Accordingly, there is a need for alternative filter and limiter designs, such as those capable of selectively filtering undesired interferers while permitting other communication signals.

SUMMARY OF THE INVENTION

The present invention relates to a self-limiting filter having an automatic-rejection capability. In particular embodiments, the filter of the invention includes a phase-change vanadium dioxide ($VO_2$) thin film located at a particular node of a resonating portion. At a particular threshold power or temperature, the $VO_2$ film undergoes a phase-change, which in turn alters the resistive state of the film. By passing an input signal through the film, the input signal imposes a change in power or temperature upon the film, which effectively changes the resistivity of the film. The phase-change capability of the film can be employed to develop a self-limiting filter that automatically rejects an input signal above that threshold power or temperature.

In one instance, the $VO_2$ film is configured to be relatively insulating at low power but conductive at a higher power. This phase-change capability can be used to form a filter. This filter, in turn, can be configured to divert an input signal to two (or more) signal pathways. If the input signal is of a sufficiently low power (i.e., below the threshold power), then the signal is diverted to a first signal pathway that travels through the circuit. Alternatively, if the input signal is of a sufficiently high power (i.e., above the threshold power), then the signal is diverted to a second signal pathway that shunts the input signal to ground. In this manner, the low-powered input signals are transmitted through the circuit, and the high-powered input signals are reflected from the remaining portion of the circuit.

Thus, when an interferer of sufficiently high power reaches the resonating portion, the $VO_2$ film undergoes a phase change that provides a conductive film, thereby shunting the interferer to ground and effectively reflecting the signal in the frequency band of the interferer. When the interferer is removed, the $VO_2$ film undergoes a phase change that restores the initial conductivity of the film (i.e., to a relatively insulating film), thereby permitting signal transmission (e.g., through the resonating portion and/or the circuit). With this approach, an array of band-select filters has the ability to reflect the signal in a channel when an interferer is present, but continue to allow signals of interest in adjacent channels to remain active.

As described herein, the phase-change or switching capability of the film depends on thermal heating of the film (e.g., having a threshold temperature of about 68° C.). This switching behavior can be induced in any useful manner, such as by a change in heat (e.g., above or below a threshold temperature), power (e.g., above or below a threshold power), voltage (e.g., above or below a threshold voltage), current (e.g., above or below a threshold current), electrical field (e.g., above or below a threshold electric field), etc., imposed by an input signal.

In one aspect, the invention features a self-limiting filter including: an input configured to receive an input signal; an output configured to transmit an output signal; a ground connection; one or more resonant portions, where at least one resonant portion is connected to the input and the output; and a phase transition material (e.g., a phase transition film) connecting at least one resonant portion (e.g., at an open end of the resonant portion) to the ground connection. In some embodiments, the phase transition material is configured to operate in a transmissive state below a threshold power (e.g., configured to relay or transmit an input signal through the filter when that input signal is below the threshold power, such as in the passband) and in a reflective state above the threshold power (e.g., configured to reflect or block an input signal through the filter when that input signal is above the threshold power, such as in the passband), thereby providing the self-limiting filter. In other embodiments, the phase transition material is conductive above a threshold power and insulating below the threshold power, thereby providing the self-limiting filter.

In another aspect, the invention features a self-limiting filter including: an input configured to receive an input signal; an output configured to transmit an output signal; a ground connection; one or more resonant portions, where at least one resonant portion is connected to the input and the output; and a shunt element connecting at least one resonant portion (e.g., at an open end of the resonant portion) to the ground connection, where the shunt element includes a phase transition material (e.g., a phase transition film).

In yet another aspect, the invention features a filter array including a plurality of self-limiting filters (e.g., any described herein). Each filter can be different (e.g., characterized by a different resonant frequency, center frequency, and/or cutoff frequency).

In other embodiments, the filter array is characterized by a passband, and each filter is characterized by a different resonant frequency, center frequency, and/or cutoff frequency within the passband.

Exemplary phase transition materials include vanadium oxide (e.g., $VO_2$, $V_2O_3$, $V_4O_7$, $V_6O_{11}$, $V_6O_{13}$, $V_5O_9$, $VO$, and $V_8O_{15}$), niobium oxide (e.g., $NbO_2$), a nickelate (e.g., $SmNiO_3$, $NdNiO_3$, and $PrNiO_3$), an iron oxide (e.g., $Fe_3O_4$), a titanium oxide (e.g., $Ti_3O_5$ and $Ti_2O_3$), a cobaltate (e.g., $LaCoO_3$), or a doped form thereof (e.g., a chromium-doped form thereof).

In any embodiment herein, each filter, individually, is a coupled-line filter, a microstrip filter, or a parallel-coupled microstrip filter.

As used herein, the term "about" means +/−10% of any recited value. As used herein, this term modifies any recited value, range of values, or endpoints of one or more ranges.

Other features and advantages of the invention will be apparent from the following description and the claims.

DETAILED DESCRIPTION OF THE INVENTION

Figure 1A:
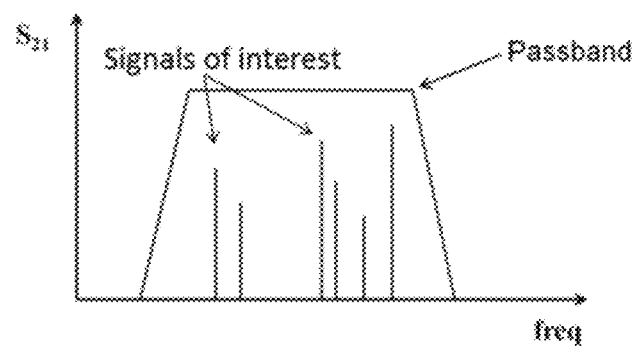
FIG. 1A-1C is a schematic showing the cognitive filter concept. (A) Individual filters make up a continuous passband containing signals of interest. When one or more interferer is present in the passband (B), the filters at the locations of the interferers begin reflecting at that frequency instead of passing signals (C). These notches remain in the passband until the interferer is no longer present.
Figure 1B:
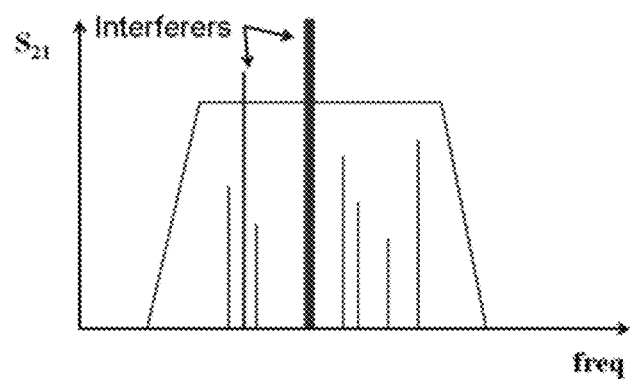

The present invention relates to a self-limiting filter, which can be an individual band-select filter have an automatic-rejection capability. In use, the filter receives a signal as normal (FIG. 1A) until the signal in its band reaches a certain power threshold, at which point the filter pole is changed into a zero, reflecting the signal of the interferer (FIG. 1B). When the interferer is removed, then filter pole is automatically reset, and the device continues to operate as normal.

Figure 1C:
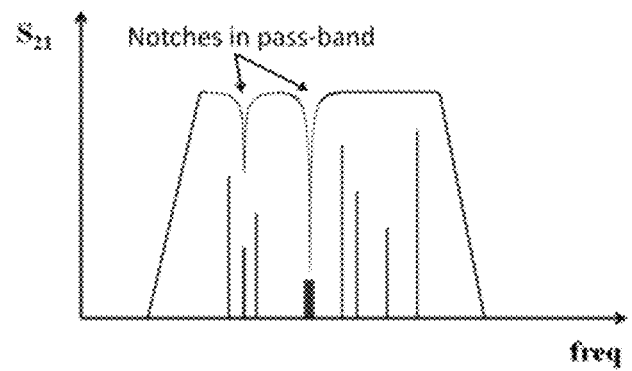

With this approach, an array of band-select filters has the ability to reflect the signal in a channel when an interferer is present, but continue to allow signals of interest in adjacent channels to remain active (FIG. 1C). This is implemented using a phase-change vanadium dioxide ($VO_2$) thin film. When the RF power in the filter increases the temperature of the film significantly, the film changes from an insulator to a metal, shorting a section of the filter and rejecting (or reflecting) further signals in that band. This approach takes advantage of the architecture of existing channelized systems. Accordingly, the present filters and arrays thereof can be implemented with such channelized systems.

Figure 3:
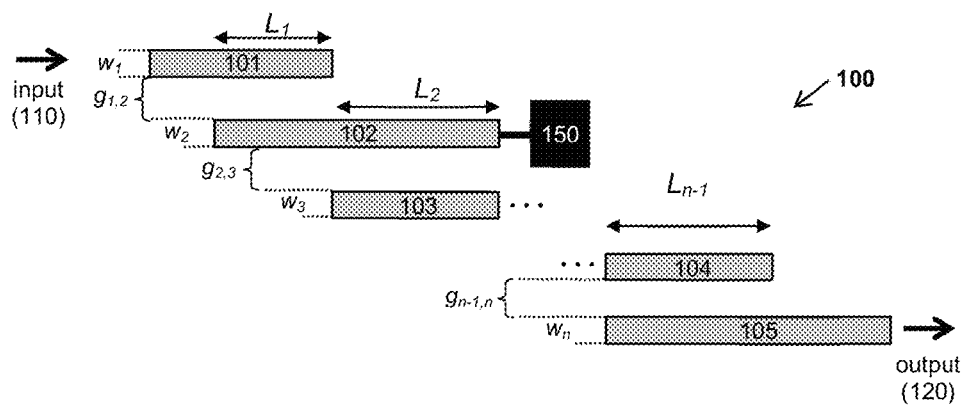
FIG. 3 is a schematic of an exemplary filter 100.

The self-limiting filter includes any useful components to receive and transmit signal, as well as to facilitate configuration with the phase change material. FIG. 3 provides an exemplary self-limiting filter 100 that is a parallel-coupled filter. The filter 100 includes a plurality of resonating portions 101-105. The first resonating portion 101 is configured to receive an input 110, and the $n^{th}$ resonating portion 105 is configured to transmit an output 120.

As can be seen, the filter can include any n number of useful resonating portions (e.g., n can be 1, 2, 3, 4, 5, 6, 7, 8, 9, 10, or more). In addition, each $n^{th}$ resonating portion can be characterized by any useful parameters related to the device's resonant frequency, center frequency, fractional bandwidth, reflected power, etc. Exemplary parameters include length of the overlapping resonating portions $L_n$ or $L_{n-1}$ (e.g., $L_1$, $L_2$, etc.), total length of each resonating portion, total length of the resonant length (i.e., a length from one end of the first resonator and the $n^{th}$ resonator), gap between resonating portions $g_{n-1,n}$ (e.g., $g_{1,2}$, $g_{2,3}$, etc.), and width of the resonating portion $w_n$ (e.g., $w_1$, $w_2$, etc.).

In one embodiment, the open end of second resonating portion 102 is connected to a phase change material 150, which in turn is connected to a ground connection (not shown). The ground connection can be a contact pad in the same plane as the resonating portions or a ground layer located beneath the device layer having the resonating portions. These connections can be made in any useful manner, such as by wirebonds, wires, leads, etc. In addition, any resonating potion can be connected to the phase change material in any useful configuration.

Exemplary phase change materials include $VO_2$, $NbO_2$, and doped forms thereof, such as $Cr_xV_{1-x}O_2$, where x is between 0 and 0.15. Other materials are described herein. In particular, doping can be used to control $T_c$, which is the temperature at which the material transitions from an insulating state (e.g., a monoclinic state) to a metallic state (e.g., tetragonal state). For instance, doping of $VO_2$ with Cr increases $T_c$ (e.g., from 50° C. up to ~75° C. at 11% Cr), such that the critical temperature and the threshold power for the device can be controlled. Exemplary dopants include chromium, titanium, germanium, iron, cobalt, nickel, molybdenum, niobium, tantalum, and/or tungsten.

The phase change material can be provided in any useful form, such as a thin film, a nanoparticle embedded in a film or a substrate (e.g., silica, a dielectric, or an insulator), a coating, etc. Methods of making, doping, and testing phase change materials are described in Scott S et al., "A frequency selective surface with integrated limiter for receiver protection," *Proc. 2012 IEEE in Antennas Propagation Soc. Int. Symp. (APSURSI)* held on 8-14 Jul. 2012, pp. 1-2; Cavalleri A et al., "Ultra-broadband femtosecond measurements of the photo-induced phase transition in VO$_2$: From the mid-IR to the hard x-rays," *J. Phys. Soc. Jpn.* 2006 January; 75(1):1-9; Futaki H et al., "Effects of various doping elements on the transition temperature of vanadium oxide semiconductors," *Jpn. J. Appl. Phys.* 1969; 8(8):1008-13; Aurelian C et al., "Chapter 3: Exploiting the semiconductor-metal phase transition of VO$_2$ materials: a novel direction towards tunable devices and systems for RF-microwave applications," pp. 35-56, in *Advanced Microwave and Millimeter Wave Technologies Semiconductor Devices Circuits and Systems*, Moumita Mukherjee (ed.), InTech, published online Mar. 1, 2010; and U.S. Pat. Nos. 7,642,881 and 8,067,996, each of which is incorporated herein by reference in its entirety.

The filters of the invention can be used to protect sensitive components against high-powered interferers. The architecture described herein allows for filter banks capable of automatically rejecting interferers, yet allowing signals of interest to pass. In particular embodiments, the filter is capable of automatically-rejecting high-powered interferers within its band, but is not affected by high-powered signals out-of-band. Other exemplary uses include switches, circuits (e.g., amplifier tuning circuits or coupler tuning circuits), shutters, transmission line systems, and receiver systems.

EXAMPLE

Example 1

Band-Selective Interferer Rejection for Cognitive Receiver Protection

In the operation of radio frequency electronics, undesirable high-powered interferers have the potential to damage sensitive receiver components such as low noise amplifiers or surface acoustic wave filters. Frequency-selective surfaces and antennas provide a first line-of-defense from these interferers by rejecting out-of-band signals. Typically, a diode or ferrite-based limiter then protects components further down the signal chain. Unfortunately, these components introduce unwanted harmonics due to clipping of the signal, and most are not compatible with traditional fabrication processes, requiring post-processing or surface mounting of components. In addition, communications are still likely inoperable, as the clipped signal is likely either still in the receiver chain, or the diode is driven to a low-impedance state, reflecting even signals of interest.

One potential solution has been presented in which a signal is sent first through a de-multiplexer (consisting of an array of bandpass filters), next a limiter array, which is made up of individual amplifiers which exhibit gain saturation, and finally, a multiplexer. Together, this yields an amplifier with "channelized limiting" properties (Rauscher C, "A channelized-limiter approach to receiver front-end protection," *IEEE Trans. Microwave Theory Tech.* 1996 July; 44(7):1125-9). In a practical case, the amplifiers would likely be replaced with individual limiters, as otherwise nothing is provided to protect the amplifiers themselves. This is a very interesting approach, but has some drawbacks. In this implementation, the isolation is limited to around 7 dB, and the additional size required by the components may be prohibitive. Furthermore, the limiter component itself would still introduce the undesirable harmonics and require surface mounting.

Limiters utilizing the phase change of vanadium dioxide VO$_2$ thin films have been proposed in Givernaud J et al., "Microwave power limiting devices based on the semiconductor-metal transition in vanadium-dioxide thin films," *IEEE Trans. Microwave Theory Tech.* 2010 September; 58(9):2352-61. As the power through a section of co-planar waveguide increases, the film gradually heats until the film undergoes a phase change at around 70° C. Benefits of this implementation include the following: reflection instead of clipping, potential for extremely-fast switching times (Cavalleri A et al., "Ultra-broadband femtosecond measurements of the photo-induced phase transition in VO$_2$: From the mid-IR to the hard x-rays," *J. Phys. Soc. Jpn.* 2006 January; 75(1):1-9) (yielding low spike leakage), and the ability to dope the film to modify the transition temperature (Futaki H et al., "Effects of various doping elements on the transition temperature of vanadium oxide semiconductors," *Jpn. J. Appi. Phys.* 1969; 8(8):1008-13). However, the limiters these authors demonstrated would begin to reflect any signal if an interferer is present, regardless of the frequency. This would render communications systems inoperable until the interferer is no longer present. This same issue is present in frequency selective surfaces with integrated limiters shown in Scott S et al., "A frequency selective surface with integrated limiter for receiver protection," *Proc. 2012 IEEE in Antennas Propagation Soc. Int. Symp. (APSURSI)* held on 8-14 Jul. 2012, pp. 1-2.

A more desirable solution is one in which individual band-select filters have an automatic-rejection capability. A filter receives a signal as normal, until the signal in its band reaches a certain power threshold, at which point the filter pole is changed into a zero, reflecting the signal of the interferer. When the interferer is removed, the filter pole is automatically reset, and the device continues to operate as normal. With this approach, an array of band-select filters has the ability to reflect the signal in a channel when an interferer is present, but continue to allow signals of interest in adjacent channels to remain active (FIG. 1). This is implemented using a phase-change vanadium dioxide (VO$_2$) thin-film. When the RF power in the filter increases the temperature of the film significantly, the film changes from an insulator to a metal, shorting a section of the filter and rejecting further signals in that band. This approach takes advantage of the architecture of existing channelized systems.

Accordingly, described herein is a new, frequency-selective limiting filter. This is accomplished by placing a phase change VO$_2$ film at the proper node of the filter. When the high-powered microwave signal reaches a certain threshold, the VO$_2$ undergoes a phase transition from the monoclinic "insulating state" to the tetragonal "metallic state." This crystallographic change is accompanied by a three order of magnitude drop in the film's resistivity, and creates a short circuit at a section of the filter, changing a pole to a zero, and rejecting further undesirable high-powered signals from damaging sensitive receiver components. This Example details the design and simulation of the filter, along with measurement results from VO$_2$ films and the filter element. This filter element began rejecting at about 2 W input power, with isolation of over 16 dB to over 23 W input power, and is unaffected by an out-of band interferer of over 25 W. The architecture presented allows for filter banks capable of automatically-rejecting interferers, yet allowing signals of interest to pass. Details follow.

Design and Fabrication:

The filter used for the proof-of-concept here is a simple two-pole coupled-line microstrip design centered around 2.4

GHz. However, the method used in this work is applicable to a wide variety of filters and frequencies. An HFSS finite element simulation (HFSS 14.0, ANSYS, Inc., Canonsburg, Pa.) was next performed to optimize the design of the filter.

Figure 2:
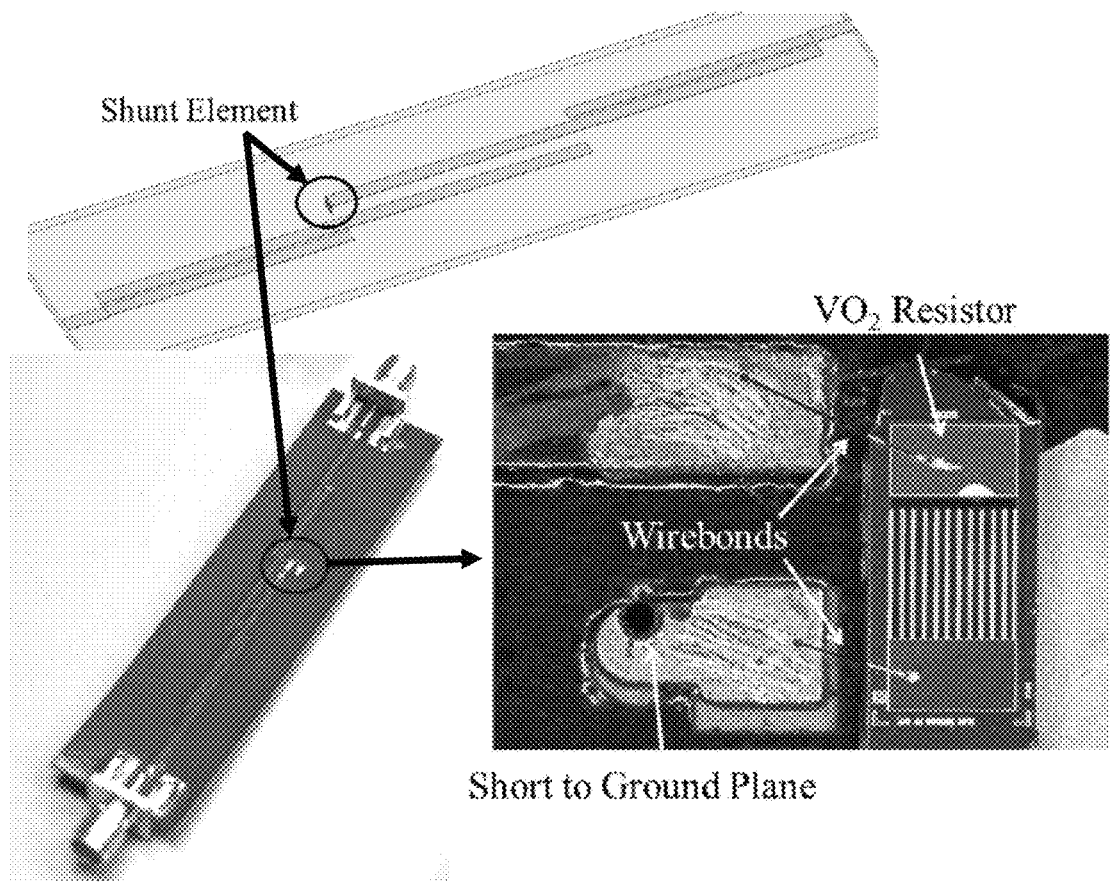
FIG. 2 shows an exemplary design of the self-limiting filter. Provided are a schematic and photographs of a simple coupled-line filter having a highly-resistive $VO_2$ film placed at the end of a resonant portion. When this film is heated beyond its critical temperature $T_c$ (or threshold temperature), the $VO_2$ transitions from an insulating state to a metallic state, thereby changing the open circuit to a short circuit. Thus, the filter reflects instead of transmits power in its passband.

Then, the filter was fabricated using traditional PCB manufacturing processes. The filter ports were 50 ohms. The resonant sections connected to the input and output lines were 0.82 mm wide. The center resonant sections were 0.92 mm wide and were separated by 1.06 mm. The overlap between each resonant section was about 15 mm, resulting in a total length for each resonant line of about 30 mm. The filter was then fabricated on a 25 mil Roger's Corporation 6006 printed circuit board (PCB) material (Rogers RT/Duroid 6006 PTFE/Ceramic Laminate, Rogers Corporation, Woodstock, Conn.). The $VO_2$ film used in this case was sputtered and patterned on a bare silicon wafer, and diced after deposition and patterning of the subsequent layers. The top metal electrodes were connected via wirebonds to the PCB below (FIG. 2). This was done solely for convenience. Sputtering and patterning the $VO_2$ directly on the PCB, or designing the filter on the wafer are possible methods of integration.

Figure 4:
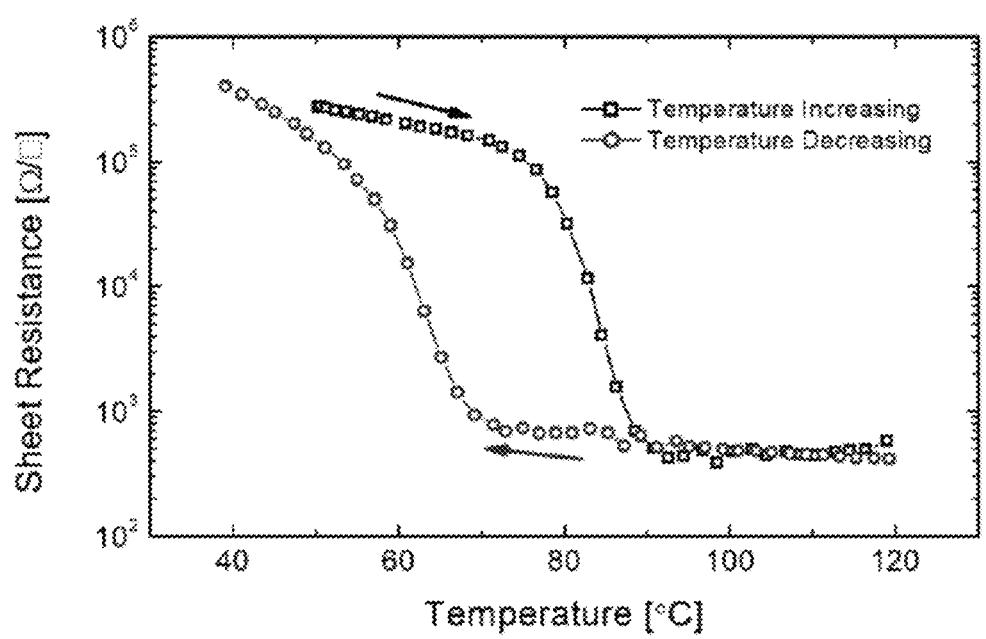
FIG. 4 shows a four-point probe measurement of $VO_2$ sheet resistance as a function of temperature. As the film heats, it changes from an insulating state to a metallic state. This low resistance shorts the filter to ground and increases the isolation of the filter.

Results:

The resistance versus temperature of the $VO_2$ resistor was measured using a hot plate and DC probes (FIG. 4). As temperature increased, the film changed from a monoclinic insulator state to a tetragonal metallic state (Zylbersztejn A et al., "Metal-insulator transition in vanadium dioxide," *Phys. Rev. B* 1975 June; 11:4383-95), and the resistivity dropped by three orders of magnitude.

Figure 5:
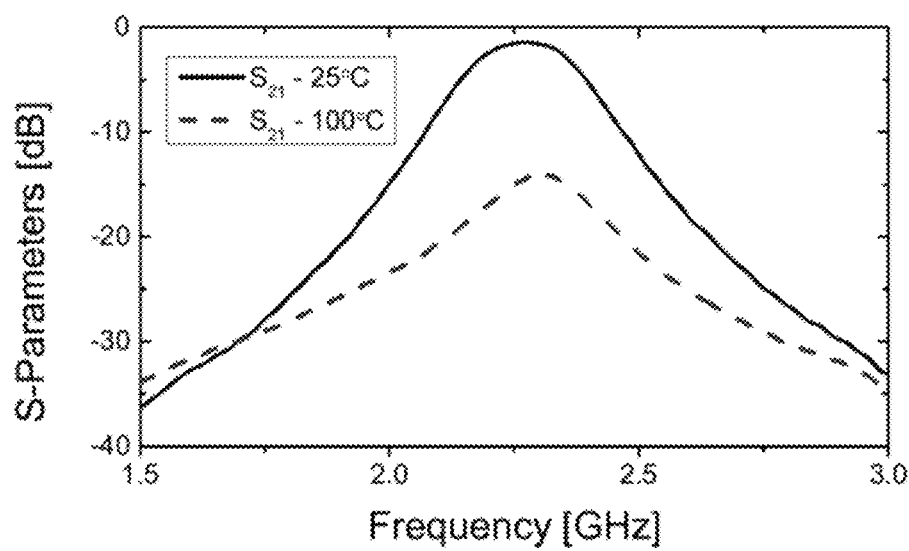
FIG. 5 shows measured S-Parameters of the self-limiting filter at low and high temperatures. Lower temperatures represent normal operating conditions, and elevated temperatures represent the filter when a high-power interferer present in the pass-band.

The S-Parameters of the filter versus temperature were measured to determine the passband of the filter. A two-port SOLT calibration was performed with SMA calibration standards on an Agilent PNA. The filter was then measured at room temperature to determine the normal (small-signal) operating condition of the filter. The temperature of the filter and $VO_2$ sample was then increased via a hotplate, and the S-Parameters were measured at elevated temperatures. The high-temperature states represented the condition of the filter when a high-power interferer is present in the band. Results shown in FIG. 5 highlight over 16 dB of isolation in the passband when a high powered interferer was present.

Figure 6:
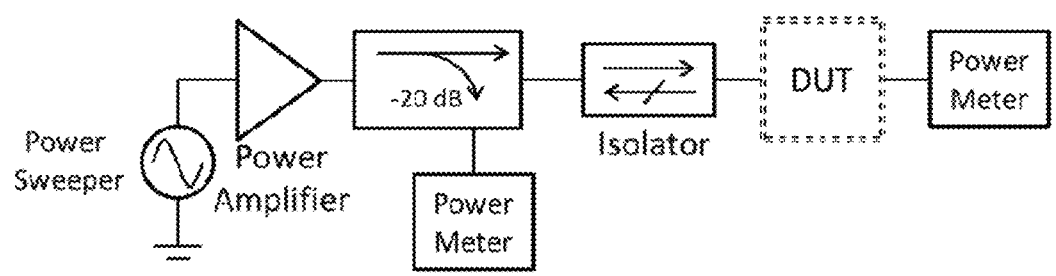
FIG. 6 is a schematic showing an exemplary power measurement setup. A synthesized sweeper ramped the power of a signal in the filter's passband. Then, the power amplifier increased the signal level, which was then recorded through a coupler as $P_{in}$. This signal was transmitted through the filter, and $P_{out}$ was recorded at the filter's output.

The power measurement setup is shown in FIG. 6. First, a synthesized sweeper outputted a 2.2 GHz (in filter passband) signal. The signal power was ramped up from −20 dBm, while a power amplifier increased the signal power. A 20 dB coupler next fed a power meter to record $P_{in}$, an isolator (in the form of a circulator with large attenuator) protected the amplifier output, and the power was delivered to the device under test. The output port of the filter fed the second channel of the power meter, corresponding to $P_{out}$.

Figure 7A:
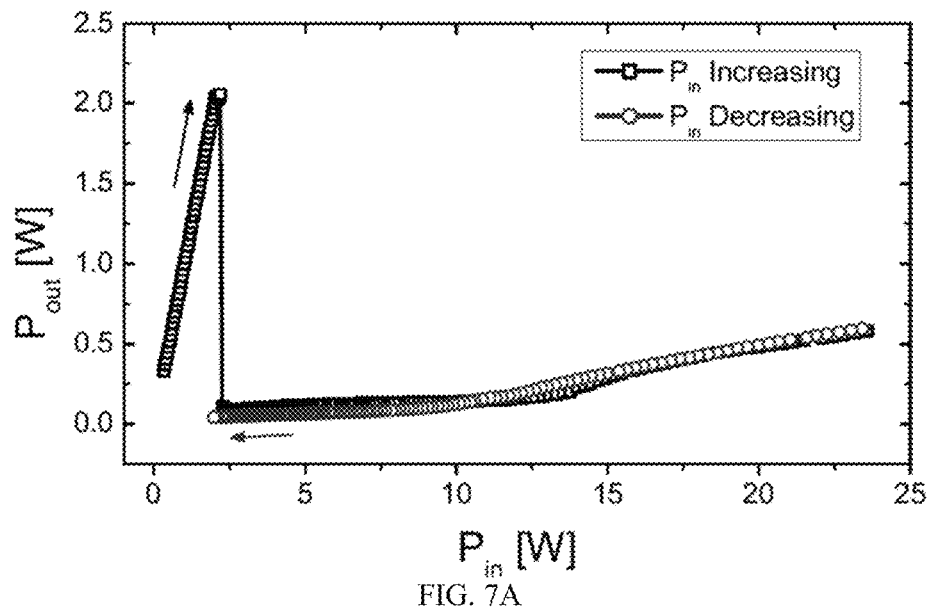
FIG. 7A-7B shows graphs of (A) measured power at the output of the filter versus power at the input and (B) measured filter isolation. As input power increased, the filter passed most of the signal until about 2 W, at which point the filter $VO_2$ film heated significantly and began to short the filter to ground. At this point, the output power decreased significantly. This continued until the input power was brought back to a low power state, at which point the filter operated again as normal.
Figure 7B:
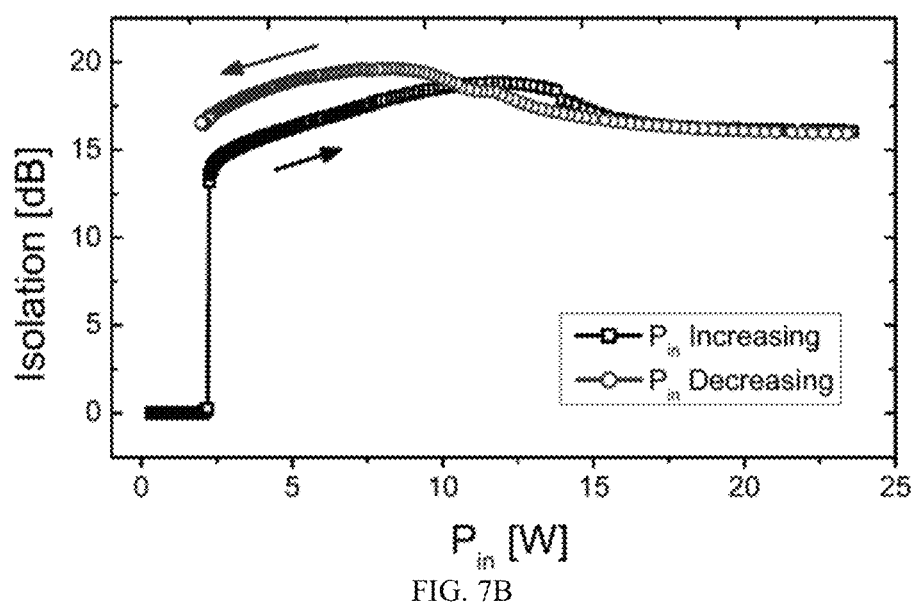

The results of the measurement are shown in FIG. 7A-7B. As the power input to the filter increased, the power output increased linearly. When the threshold power as reached, the $VO_2$ film was heated to its transition point and shunted the filter to ground. Then, the filter began to reflect instead of transmit the signal.

The isolation increased with further power increase. Once the filter was brought again to a low-power state, it returned to its normal operating state. Note that when power was not in the passband of the filter, an insufficient field was generated at the location of the $VO_2$ for the device to heat up. This was demonstrated by sweeping a 1.5 GHz signal (outside of the filter's passband) up to 25 W and observing the filter's transfer characteristics.

In conclusion, described herein is a band-selective rejection of interferers, along with design, simulation, and measurement of a filter with automatic limiting capability. This was enabled by the phase transition of vanadium dioxide thin-films materials. The filter exhibited over 16 dB of isolation when an interferer is present. Future iterations will demonstrate multiband functionality, and allow for direct integration by directly fabricating the filter and sputtering the $VO_2$ film on the filter substrate directly.

Other Embodiments

All publications, patents, and patent applications mentioned in this specification are incorporated herein by reference to the same extent as if each independent publication or patent application was specifically and individually indicated to be incorporated by reference.

While the invention has been described in connection with specific embodiments thereof, it will be understood that it is capable of further modifications and this application is intended to cover any variations, uses, or adaptations of the invention following, in general, the principles of the invention and including such departures from the present disclosure that come within known or customary practice within the art to which the invention pertains and may be applied to the essential features hereinbefore set forth, and follows in the scope of the claims.

Other embodiments are within the claims.

The invention claimed is:

1. A self-limiting filter comprising:
    an input configured to receive an input signal;
    an output configured to transmit an output signal;
    a ground connection;
    one or more resonant portions, wherein at least one resonant portion is connected to the input and the output; and
    a phase transition film connecting at least one resonant portion to the ground connection, wherein the phase transition film is configured to operate in a transmissive state below a threshold power and in a reflective state above the threshold power, thereby providing the self-limiting filter.

2. The self-limiting filter of claim 1, wherein the phase transition film comprises a vanadium oxide, a niobium oxide, a nickelate, an iron oxide, a titanium oxide, a cobaltate, or a doped form thereof.

3. The self-limiting filter of claim 1, configured to return to the transmissive state upon shunting an interferer that imposes a power above the threshold power.

4. A filter array comprising a plurality of self-limiting filters, wherein each self-limiting filter, individually, comprises:
    an input configured to receive an input signal;
    an output configured to transmit an output signal;
    a ground connection;
    one or more resonant portions, wherein at least one resonant portion is connected to the input and the output; and
    a phase transition film connecting at least one resonant portion to the ground connection, wherein the phase transition film is configured to operate in a transmissive state below a threshold power and in a reflective state above the threshold power, thereby providing the self-limiting filter.

5. The filter array of claim 4, wherein each self-limiting filter comprises a different resonant frequency, center frequency, and/or cutoff frequency.

6. The filter array of claim 5, wherein the phase transition film comprises a vanadium oxide, a niobium oxide, a nickelate, an iron oxide, a titanium oxide, a cobaltate, or a doped form thereof.

7. The filter array of claim 6, wherein each filter, individually, is a coupled-line filter, a microstrip filter, or a parallel-coupled microstrip filter.

8. The filter array of claim 4, wherein the filter array comprises a passband.

9. The filter array of claim 8, wherein each self-limiting filter is characterized by a different resonant frequency, center frequency, and/or cutoff frequency within the passband.

10. The filter array of claim 4, wherein the filter array is configured to reflect an input signal when an interferer is present but to allow one or more other input signals of interest that is below the threshold power.

11. The filter array of claim 4, wherein the filter array is configured to return to the transmissive state upon shunting an interferer that imposes a power above the threshold power.

* * * * *